(12) United States Patent
Alsop et al.

(10) Patent No.: US 11,262,949 B2
(45) Date of Patent: Mar. 1, 2022

(54) COMMAND THROUGHPUT IN PIM-ENABLED MEMORY USING AVAILABLE DATA BUS BANDWIDTH

(71) Applicant: Advanced Micro Devices, Inc., Santa Clara, CA (US)

(72) Inventors: Johnathan Alsop, Santa Clara, CA (US); Shaizeen Aga, Santa Clara, CA (US); Nuwan Jayasena, Santa Clara, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/885,677

(22) Filed: May 28, 2020

(65) Prior Publication Data

US 2021/0373805 A1  Dec. 2, 2021

(51) Int. Cl.
*G06F 3/06* (2006.01)
*G06F 12/00* (2006.01)
*G06F 13/00* (2006.01)

(52) U.S. Cl.
CPC .......... *G06F 3/0659* (2013.01); *G06F 3/0611* (2013.01); *G06F 3/0629* (2013.01); *G06F 3/0653* (2013.01); *G06F 3/0683* (2013.01)

(58) Field of Classification Search
CPC .... G06F 3/0611; G06F 3/0629; G06F 3/0653; G06F 3/0659; G06F 3/0683
USPC ...................................................... 711/154
See application file for complete search history.

(56) References Cited

U.S. PATENT DOCUMENTS

| | | | | |
|---|---|---|---|---|
| 10,332,586 B1* | 6/2019 | Hush | ................... | G11C 11/4085 |
| 2003/0126353 A1* | 7/2003 | Satoh | ....................... | G11C 8/06 |
| | | | | 711/100 |
| 2005/0210216 A1* | 9/2005 | Jobs | .................... | G06F 13/1684 |
| | | | | 711/170 |
| 2006/0067146 A1* | 3/2006 | Woo | ....................... | G11C 7/065 |
| | | | | 365/206 |
| 2008/0040559 A1* | 2/2008 | Wolford | .............. | G06F 12/0844 |
| | | | | 711/150 |
| 2009/0006823 A1* | 1/2009 | Luick | ................... | G06F 9/3869 |
| | | | | 712/225 |
| 2011/0107011 A1* | 5/2011 | Russo | ................... | G06F 12/023 |
| | | | | 711/103 |
| 2015/0063052 A1* | 3/2015 | Manning | ............. | G06F 12/0246 |
| | | | | 365/230.01 |

(Continued)

*Primary Examiner* — Mohamed M Gebril
(74) *Attorney, Agent, or Firm* — Hickman Becker Bingham Ledesma LLP; Edward A. Becker

(57) ABSTRACT

An approach is provided for reducing command bus traffic between memory controllers and PIM-enabled memory modules using special PIM commands. The term "special PIM command" is used herein to describe embodiments and refers to a PIM command for which the corresponding module-specific command information is provided to memory modules via a non-command bus data path. A memory controller generates and issues a special PIM command to multiple PIM-enabled memory modules via a command bus and provides module-specific command information (e.g., address information) for the special PIM command to the PIM-enabled memory modules via the non-command bus data path that is shared by the PIM-enabled memory modules and the memory controller.

18 Claims, 3 Drawing Sheets

(56) References Cited

U.S. PATENT DOCUMENTS

| | | | |
|---|---|---|---|
| 2017/0235515 A1* | 8/2017 | Lea | G06F 3/0625 |
| | | | 711/105 |
| 2017/0285988 A1* | 10/2017 | Dobelstein | G11C 11/4076 |
| 2017/0337126 A1* | 11/2017 | Zawodny | G11C 7/1006 |
| 2018/0107406 A1* | 4/2018 | O | G06F 3/0683 |
| 2018/0130506 A1* | 5/2018 | Kang | H04L 29/06 |
| 2018/0275883 A1* | 9/2018 | Lea | G06F 13/4022 |
| 2018/0276151 A1* | 9/2018 | Lea | G11C 7/1006 |
| 2018/0364908 A1* | 12/2018 | Lea | G11C 11/4094 |
| 2019/0065110 A1* | 2/2019 | Lea | G06F 3/0659 |
| 2019/0065111 A1* | 2/2019 | Lea | G06F 3/0604 |
| 2019/0066761 A1* | 2/2019 | Lea | G11C 7/1006 |
| 2020/0356305 A1* | 11/2020 | Kim | G06F 3/0656 |
| 2021/0110876 A1* | 4/2021 | Seo | G11C 16/30 |

* cited by examiner

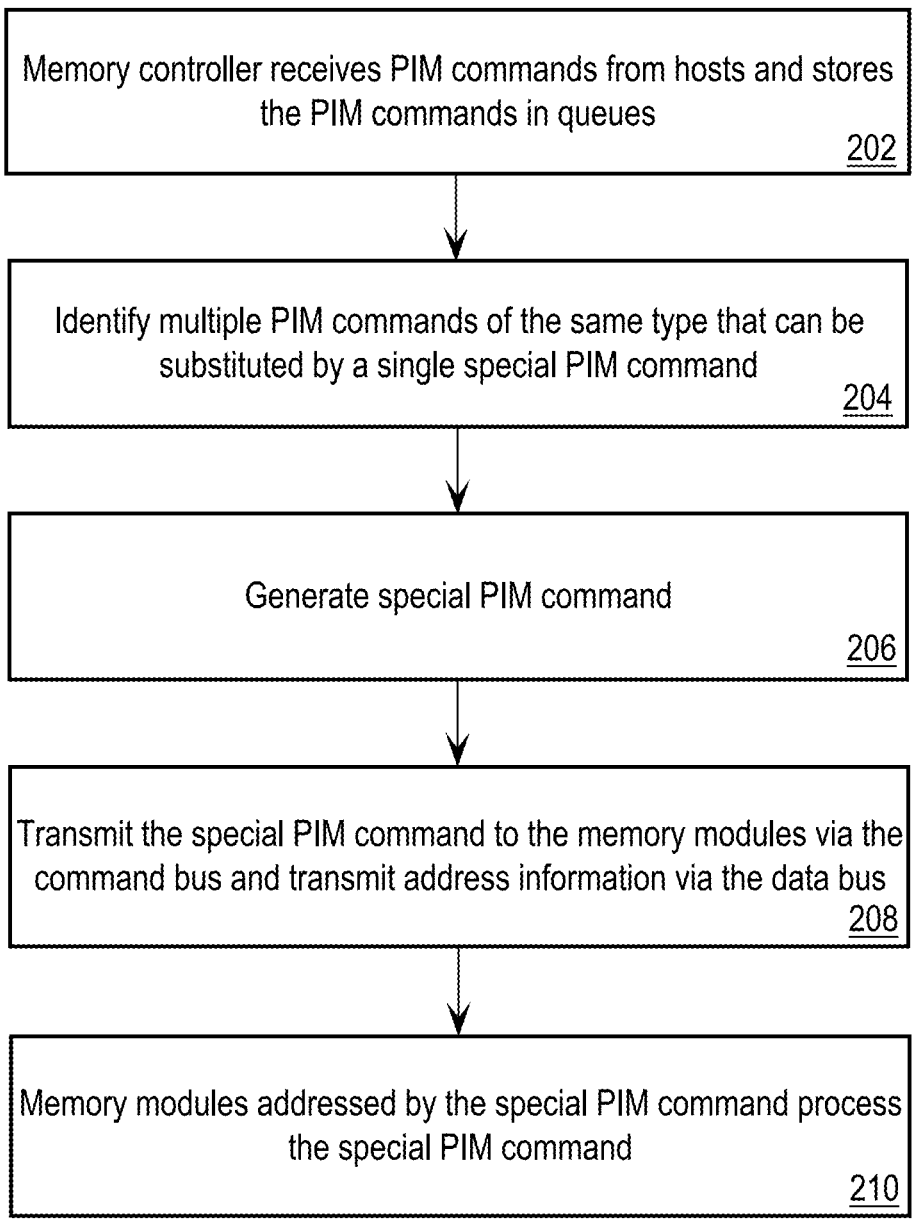

COMMAND THROUGHPUT IN PIM-ENABLED MEMORY USING AVAILABLE DATA BUS BANDWIDTH

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Further, it should not be assumed that any of the approaches described in this section are well-understood, routine, or conventional merely by virtue of their inclusion in this section.

As computing throughput scales faster than memory bandwidth, various techniques have been developed to keep the growing computing capacity fed with data. Processing In Memory (PIM) incorporates processing capability within memory modules so that tasks can be processed directly within the memory modules. This allows a memory controller to trigger computation across multiple memory modules in parallel without requiring data movement across an interface to and from the memory module (i.e., the memory module interface), which can greatly improve performance.

One of the requirements with certain PIM techniques is that, to achieve optimum performance, all of the memory modules must perform the same operation. For example, a row activate PIM command provided to all memory modules must load the contents of the row identified by the same row ID value into the row buffer at each memory module, and a column access PIM command must access the value at the same column ID value from the row buffer in each memory module. This works well for highly regular parallel workloads that perform the same operation on each element in a well-aligned contiguous array. If the array is appropriately aligned across memory modules, row activate and column access PIM commands can be sent to all memory modules in parallel, since they will use the same row and column IDs. However, if memory accesses are sparse or irregular, or the memory module address mapping leads to imperfect alignment, each memory module may need to access different rows and columns. This requires that a separate PIM command, with different address information, be sent to each memory module, which leads to command bus congestion and limits performance. Sparse or irregular memory accesses are common, for example, in machine learning, neural network-based recommendation engines, and large-scale graph analytics. A possible alternative solution is to increase the number of channels or command wires per channel, but this is expensive and is wasteful for conventional workloads that have a static balance of command to data demand.

BRIEF DESCRIPTION OF THE DRAWINGS

Embodiments are depicted by way of example, and not by way of limitation, in the figures of the accompanying drawings and in which like reference numerals refer to similar elements.

FIG. 2 is a flow diagram that depicts an approach for reducing command bus traffic between memory controllers and PIM-enabled memory modules using special PIM commands.

DETAILED DESCRIPTION

Figure 1A:
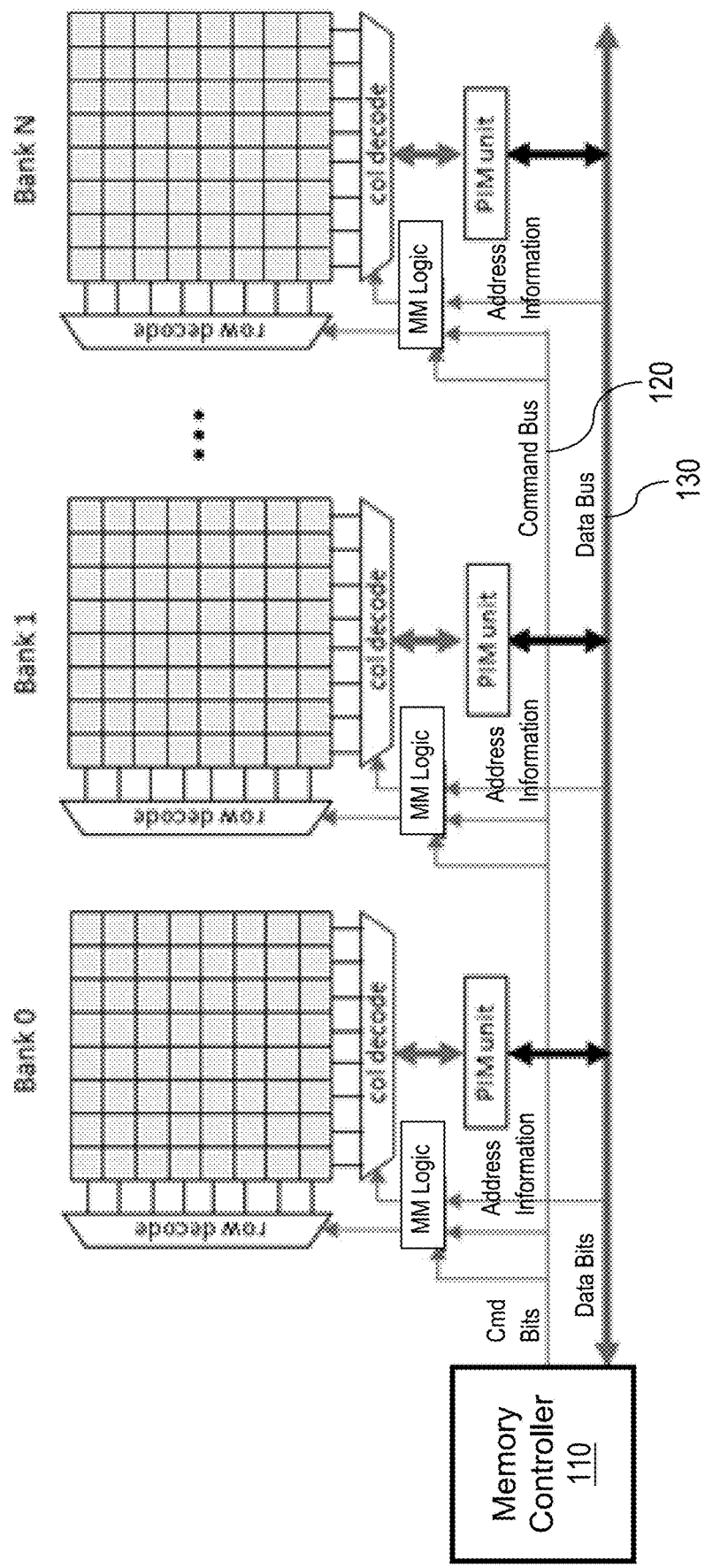
FIG. 1A is a block diagram that depicts a memory arrangement.

In the following description, for the purposes of explanation, numerous specific details are set forth in order to provide a thorough understanding of the embodiments. It will be apparent, however, to one skilled in the art that the embodiments may be practiced without these specific details. In other instances, well-known structures and devices are shown in block diagram form in order to avoid unnecessarily obscuring the embodiments.

I. Overview
II. Architecture
III. Special PIM Commands
IV. Processing of Special PIM Commands by Memory Modules
V. Generating Special PIM Commands

I. Overview

An approach is provided for reducing command bus traffic between memory controllers and PIM-enabled memory modules using special PIM commands. The term "special PIM command" is used herein to describe embodiments and refers to a PIM command for which the corresponding address information is provided to memory modules via a non-command bus data path, such as a data bus, a side channel bus, control bus, etc. Although embodiments are depicted in the figures and described herein in the context of a data bus for purposes of explanation, embodiments are not limited to transmitting special PIM commands via a data bus. As used herein, the term "data bus" refers to a wired, wireless or other type of connection that provides for the exchange of data between a memory controller and one or more memory modules. A memory controller generates and issues a special PIM command to multiple PIM-enabled memory modules via a command bus and provides address information for the special PIM command to the PIM-enabled memory modules via a data bus that is shared by the PIM-enabled memory modules and the memory controller. As used herein, the term "PIM-enabled memory module" refers to any type of computer memory that includes PIM capabilities and includes, for example, PIM-enabled Dynamic Random-Access Memory (DRAM).

This approach provides a technical solution to the problem of command bus congestion in PIM-based memory arrangements. The solution reduces the amount of data transmitted over a command bus between a memory controller and PIM-enabled memory modules by substituting multiple PIM commands with a special PIM command that is executed by multiple PIM-enabled memory modules and providing information specific to each individual command (e.g., address information, command index bits for a single command code sent to multiple memory modules, etc.) to the corresponding PIM-enabled memory modules via a data bus in an example embodiment. Furthermore, the solution allows different command or address information, e.g., different bank row and column values, to be provided to each PIM-enabled memory module. This provides better utilization of both the command bus and the data bus. Also, the approach, in an example embodiment, may be implemented with only minor changes to existing memory interfaces by repurposing existing unused command bits to identify special PIM commands and to specify PIM-enabled memory modules to process the special PIM commands. Further, changes to existing memory interfaces is reduced by utilizing the existing data bus, when it is underutilized, to communicate information specific to each individual command to the corresponding PIM-enabled memory modules instead of introducing a bespoke bus for this information.

II. Architecture

FIG. 1A is a block diagram that depicts a memory arrangement 100. The memory arrangement 100 includes N+1 PIM-enabled memory modules. Embodiments are depicted in the figures and described herein in the context of banks with cells defined by a two-dimensional array for purposes of explanation, but embodiments are not limited to banks or banks with cells defined by a two-dimensional array and are applicable to other memory cell organizations. Each bank includes row and column decode logic, controlled by Memory Module (MM) logic. The MM logic selects particular memory locations via the row and column decode logic in response to commands (Cmd bits) received from a memory controller 110 via a command bus 120. As depicted in FIG. 1A, the command bus 120 is shared by the memory controller 110 and all of the banks. As used herein, the term "bus" refers to any type of wired or wireless electrical coupling, such as wires, conductors, and/or wireless communications links. In addition, although embodiments are described herein in the context of buses, embodiments are not limited to buses per se and are applicable to other forms of memory connections, such as serial links and capacitive/inductive coupling.

The MM logic and PIM units of each bank and the memory controller 110 share a data bus 130 for carrying data. As described in more detail hereinafter, address or other information for special PIM commands is provided to the MM logic for each bank via the data bus 130 that is shared by all of the banks and the memory controller 110. The MM logic for each bank is configured to obtain its corresponding information for a special PIM command sent to all of the banks, or a subset of the banks. This allows the memory controller 110 of an example embodiment to issue a single special PIM command to multiple banks and each bank to obtain its respective information, e.g., address information such as row and column values, which may be different for each bank, from the data bus 130, instead of the command bus 120. The MM logic for each bank may include memory for storing its corresponding information that is used in response to a subsequent special PIM command, as describe in more detail hereinafter. Each bank also includes a PIM unit that provides local processing capability for each bank and may include, for example, a small form factor processor, although embodiments are not limited to any particular type of PIM.

The memory controller 110 manages the flow of data going to and coming from the memory modules and may be implemented as a stand-alone element, for example on a separate die from a microprocessor, implemented separate from but on the same die as a microprocessor, or integrated into a microprocessor as an integrated memory controller. The memory arrangement 100 may include other elements that are not depicted in the figures and described herein for purposes of explanation.

III. Special PIM Commands

Figure 1B:
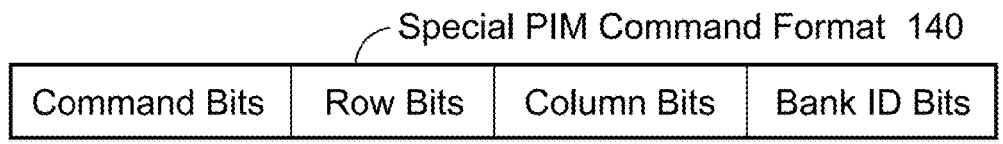
FIG. 1B depicts a special PIM command format that includes command bits, row bits, column bits, and bank ID bits.

Special PIM commands are PIM commands that include one or more bit values that indicate to memory modules, and more specifically the MM logic, that module-specific command information for the special PIM commands should be obtained from, in an example embodiment, the data bus 130 instead of the command bus 120. FIG. 1B depicts a generalized special PIM command format 140 that includes command bits, row bits, column bits, and bank ID bits. Embodiments are not limited to the example format depicted in FIG. 1B and embodiments may use fewer bits or more bits of various types, depending upon a particular implementation. For example, some commands may not include row bits or command bits, as described in more detail hereinafter.

The command bits specify a particular command, such as a row activate command, a load command, a store command, an arithmetic command, etc. The number of command bits depends upon the number of commands supported and may be, for example, three bits for eight commands, four bits for sixteen commands, etc. The row bits and column bits specify a target row and/or column for the command. For example, for a row activate command, the row bits specify the row to be activated and the column bits are not used, or not included in the command. As another example, for a load command, a store command, or an arithmetic command, the column bits specify the column that data is to be read from or written to, respectively, and the row bits are not used, or not included in the command. Alternatively, load, store and arithmetic commands may specify both row and column bits, depending upon a particular implementation.

The number of row and column bits in a special PIM command may vary depending upon a particular memory structure. One non-limiting example is five column bits and 10 row bits. The bank ID bits identify the PIM-enabled memory module(s) to execute the special PIM command and may be implemented, for example, as a bit mask. For a bit mask, the number of bits is equal to the number of banks per channel. However, this size is not required. Any arbitrary function may be used to map any number of bits to subsets of banks as long as both sides of the communication agree on the function, and this function may be fixed or programmable.

According to an embodiment, one or more bits in the special PIM command format 140 identify the PIM command as a special PIM command and instruct the target PIM-enabled memory modules to acquire their respective information from the data bus 130. One example in the context of an arithmetic command is an "Add All" special PIM command that specifies a particular set of PIM-enabled memory modules to execute the command and the address information for the "Add All" special PIM command is transmitted to the particular set of PIM-enabled memory modules via the data bus 130. The particular bits used to identify a special PIM command may vary depending upon a particular implementation and embodiments are not limited to particular bits. For example, the command bits may specify a special PIM command, such as a special activate, a special load, or a special store command. As another example, an unused command code may be used to specify a special PIM command. When the command bits are used to identify a special PIM command, the row bits, column bits, and bank ID bits, or any combination thereof, e.g., in the form of a bit mask, specify the particular PIM-enabled memory modules that are to execute the special PIM command. For example, for an implementation having eight memory modules, the row bits, column bits, and bank ID bits, or any combination thereof, may specify a particular subset of PIM-enabled memory modules, i.e., a multicast special PIM command, or all of the PIM-enabled memory modules, i.e., a broadcast special PIM command, to execute the special PIM command. A single bit value may be used to classify a special PIM command as a multicast or broadcast special PIM command, i.e., a special PIM command to be processed by a subset or all of the memory modules. The row bits and column bits are available for this purpose since the address information for the special PIM command is provided to the PIM-enabled memory modules via the data bus 130, instead of as part of the special PIM command on the command bus 120. Similarly, a single command code (e.g., "* All") may be used to indicate simply that some command should be executed across multiple memory modules, and the bits specifying the exact command can be sent along with the row, column, and bank information across the data bus (or the bank/row/column bits of the command bus). These bits may be a single command ID for all memory modules, or an individual command ID for each module (enabling the combination of multiple different PIM command types into a single special command). Transmission of this module-specific information on the data bus and in unused command bits may occur concurrent with the special command, prior to the special command (registers in the PIM module may latch this data in response to a special "latch special info" command), or a combination of both.

In an alternative embodiment, the command bits are not used to identify the PIM command as a special PIM command at all, and this is instead identified by a predefined special value being used for any of the row bits, column bits, or bank ID bits, or any combination thereof. For example, a reserved target address (or set/range of reserved addresses) may be used to identify the PIM command as a special PIM command. Whenever the specified subset of address bits matches the reserved address, the PIM-enabled memory modules at which the special PIM command should be executed are specified via remaining address bits and/or bits on the data bus. PIM-enabled memory modules may be identified, for example, by an ID, reference number, index value, etc.

IV. Processing of Special PIM Commands by Memory Modules

The MM logic in each PIM-enabled memory module is configured to identify and process special PIM commands based upon the particular methodology employed by the memory controller 110 to identify special PIM commands and the PIM-enabled memory modules that should process the special PIM commands. This includes the MM logic examining one or more bits in PIM commands to determine whether the PIM commands are special PIM commands and should be processed accordingly. If the MM logic determines that a particular PIM command is a special PIM command, by examining the appropriate bits, then the MM logic examines bits in the special PIM command to identify the PIM-enabled memory modules that should process the special PIM command. This may include, for example, determining whether the corresponding PIM-enabled memory is designated in the bit mask.

Figure 1C:
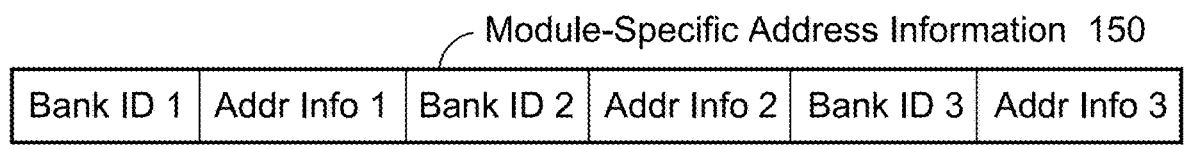
FIG. 1C depicts example address information transmitted over a data bus.

If the MM logic determines that the corresponding PIM-enabled memory module should process the special PIM command, then the MM logic retrieves module-specific command and/or address information from the data bus 130. FIG. 1C depicts example module-specific address information 150 transmitted over the data bus 130. In this example, the module-specific address information 150 includes sets of bank IDs and corresponding address information (Addr Info). Each bank ID is data that uniquely identifies a particular bank and is followed by address information for the particular bank. Alternatively, instead of using Bank IDs, bank address information is included in a pre-determined location, e.g., in particular bits, of the data on the data bus 130. The address information may be, for example, a row value and a column value.

According to an embodiment, the MM logic uses the bank ID to latch and store the corresponding address information. The MM logic may obtain the module-specific address information 150 from the data bus 130 in response to a timing signal from the memory controller 110. The address information may be stored locally in memory implemented in the MM logic. The MM logic then uses the address information to select the appropriate row and column by providing the row and column value to the row and column decode logic, for example in response to a subsequent special PIM command. The address information provided on the data bus 130 may be full or partial address information. For example, the address information provided to the memory modules via the data bus 130 may include all of the information that the MM logic needs to select the correct memory location via the row and column decode logic. Alternatively, a special PIM command may specify a base address and the module-specific address information 150 includes an offset value for each bank. The MM logic at each bank calculates a full address using the base address specified in the special PIM command and the offset value specified in the module-specific address information 150. The base address and offset information may be communicated by two or more special PIM commands in some embodiments, including the base address being communicated once via one special PIM command and being used repeatedly for multiple subsequent special PIM commands communicating sets of offset values. In yet other embodiments, a shared base address may be communicated on the command bus 120 using a variant of the command format 140, while the offsets are communicated on the data bus 130 using a variant of the module-specific address information 150.

The module-specific command information, such as the module-specific address information 150 may be transmitted on the data bus 130 via a longer latency command or using multiple time periods. For example, the memory controller 110 may issue a first command to send the module-specific address information 150 to the memory modules, which may store the relevant command and/or address information at each memory module, followed by a second command to instruct the memory modules to use the stored command and/or address information. This provides more time for the address information to be obtained correctly by the memory modules and also provides additional bits for address information. This can also further reduce changes to existing memory interfaces that may have specific timing relationships between corresponding transfers on command bus 140 and data bus 130, e.g., where data bus transfers may occur later in time with respect to the corresponding command bus transfers.

V. Generating Special PIM Commands

The memory controller 110 manages the flow of data between the memory modules and other computing elements, such as host processors. This includes PIM commands issued by host processors. The memory controller 110 maintains mapping data that maps physical memory addresses specified in PIM commands to memory module addresses and uses the mapping data to issue PIM commands to specific memory modules.

Figure 1D:
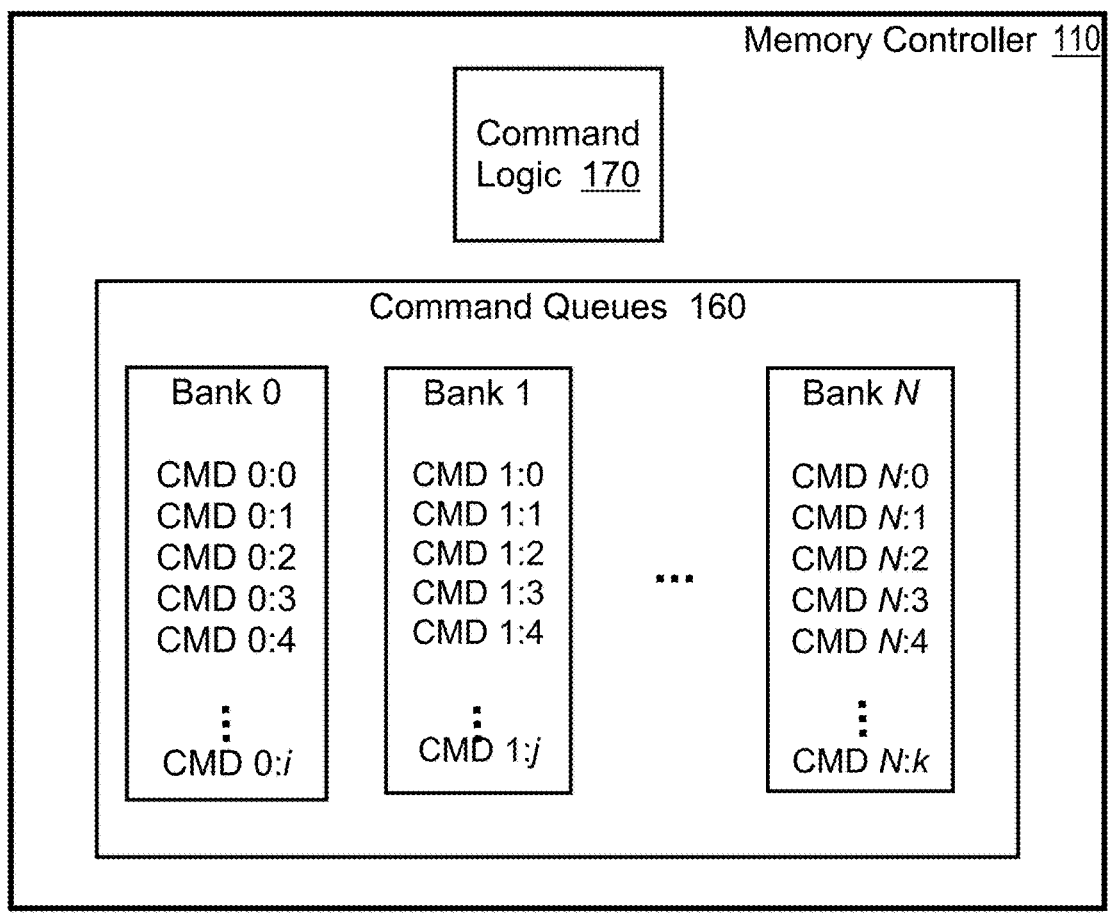
FIG. 1D depicts an example implementation of a memory controller that includes command queues and command logic.

FIG. 1D depicts an example implementation of the memory controller 110 that includes command queues 160 and command logic 170. The command queues 160 are any type of memory that store commands for each of the banks depicted in the memory arrangement 100 of FIG. 1A. The memory controller 110 receives a PIM command from a host processor, uses the mapping data to identify the appropriate bank to process the PIM command, and stores the command in the queue for the bank. This process may involve various types of processing, such as transforming a global memory address in the request to an internal address or location in the target bank, etc. In the example depicted in FIG. 1D, a separate command queue is maintained for each bank, but embodiments are not limited to this example and commands for the banks may be stored together or separately in any number of queues, including a single queue. The command queues 160 may be any type of queue, such as first-in-first-out or first-in-last-out queues. The command queues for Banks 0 through N include i, j, and k, commands, respectively, which may be the same or different. The commands may be, for example, load commands, store commands, arithmetic commands, etc., received from one or more host processors.

The command logic 170 may be implemented by computer hardware, computer software, or any combination of computer hardware and computer software, and acts as an arbiter and selects commands for processing from the command queues 160. The command logic 170 analyzes PIM commands stored in the command queues 160 and generates a special PIM command in place of multiple PIM commands.

According to an embodiment, the command logic 170 examines the first entry in each of the command queues 160 to identify PIM commands that may be combined into a single special command. If a single command type is sent for all banks in a special command, then commands can be combined if they are of the same type (or different types, two or more of which involve generating row activate commands to open the target row), they target different memory modules, and the command to be issued does not use the data bus (e.g., row activate commands, PIM arithmetic commands). If the special command interface supports different command types for different modules, then the only requirement for combining commands is that they target different modules and do not use the data bus. The command logic 170 then generates a single special PIM command that is issued to multiple banks (or memory modules) in place of the multiple PIM commands, i.e., the memory controller 110 transmits the special PIM command to the banks via the command bus 120 instead of the individual commands stored in the command queues 160. As previously described herein, bit values in the special PIM command are set to identify the PIM command as a special PIM command to the memory modules and more specifically, to the MM logic of the memory modules. In addition, the bit values specify the particular memory modules to process the special PIM command, for example, via a bit mask in the special PIM command. Address information for the single special PIM command is transmitted to the banks via the data bus 130, as previously described herein, and the memory modules designated in the special PIM command obtain their respective address information, such as row and column ID values, via the data bus 130.

As an alternative to examining the first entry in each of the command queues 160 to identify multiple PIM commands that can be combined, the command logic 170 may examine multiple entries in each of the command queues 160 and the number of entries to examine in each queue may be configured in the memory controller 110, for example via an operating system command that sets a depth value for special PIM commands. Increasing the depth value provides improved performance by a greater reduction in command bus traffic, by virtue of a greater number of PIM commands being examined as candidates to be substituted by a single special PIM command, which in turn increases the likelihood of more PIM commands being substituted by a single special PIM command, but at the expense of increased computational costs and/or time by the memory controller 110 attributable to the memory controller 110 examining a greater number of queue entries. In some embodiments, the number of commands to examine in each queue is set during hardware design time and may be up to all valid entries in each queue.

Alternatively, a count of each type of PIM command in each queue, or a specified number of entries in each queue, may be maintained. When the command logic 170 selects a next PIM command to be processed from one of the queues, the command logic 170 checks the counts and if there are PIM commands of the same type in multiple other queues, based upon the counts, then the command logic 170 searches those other queues for the PIM commands of that type. This reduces the amount of searching that the command logic 170 has to perform to determine whether there are multiple PIM commands of the same type that can be substituted with a special PIM command.

According to an embodiment, the command logic 170 determines whether to generate special PIM commands in place of multiple PIM commands stored in the command queues 160 based upon the satisfaction of one or more criteria. One example criterium is data bus utilization. A measurement of the utilization of the data bus 130 is determined, for example at a particular measurement time, or an average utilization is determined over multiple measurement times. If the measured utilization of the data bus 130 satisfies a bus utilization threshold, e.g., is less than the bus utilization threshold, then the command logic 170 uses special PIM commands.

Another example criterium is the number of PIM commands in the command queues 160 that can be substituted by the special PIM command. If the number of PIM commands of a particular type satisfies a specified threshold, e.g., is greater than the specified threshold, then the command logic 170 uses special PIM commands. Other criteria may be used, either alone or in combination with the criteria discussed above. The command logic 170 may reevaluate the criteria periodically or at special times and switch from not using special PIM commands to using special PIM commands, and vice versa, based upon whether the criteria are satisfied at any point in time. The use of special PIM commands, or specific special PIM commands, may be initiated in response to a command, for example, an operating system command or an application software command. This allows software applications to invoke the use of the special PIM command when performing certain types of processing that are known to involve sparse or irregular memory accesses, such as machine learning, neural network-based recommendation engines, and large-scale graph analytics, etc., and would benefit from using special PIM commands to reduce command bus congestion and improve performance.

FIG. 2 is a flow diagram 200 that depicts an approach for reducing command bus traffic between memory controllers and PIM-enabled memory modules using special PIM commands. In step 202, a memory controller receives PIM commands from one or more hosts and stores the PIM commands in queues for memory modules. For example, the memory controller 110 receives PIM commands from host processors, uses mapping data that maps physical memory addresses to memory modules to identify the memory modules that should process the PIM commands, and then stores the PIM commands in the corresponding queues for those memory modules.

In step 204, stored PIM commands are analyzed to identify multiple PIM commands of the same type that can be substituted by a single special PIM command. As previously described herein, the command logic 170 identifies multiple PIM commands in the queues, either by examining the entries in the queues or counters that track the different types of PIM commands in each queue, that can be substituted by a single special PIM command.

In step 206, a special PIM command is generated based upon the identified PIM commands. For example, the command logic 170 generates a special PIM command that includes one or more bit values selected to both: 1) identify the PIM command as a special PIM command to the receiving memory modules, and more specifically to the MM logic of the receiving memory modules, e.g., via a designated bit for special PIM commands and 2) specify the particular memory modules that should process the special PIM command, e.g., via a bit mask in the special PIM command. As previously described herein, and In step 208, the special PIM command is transmitted to the memory modules via the command bus and address information for the special PIM command is transmitted to the memory modules via the data bus.

In step 210, the memory modules addressed by the special PIM command process the special PIM command. According to an embodiment, the MM logic of each memory module examines the contents of the special PIM command transmitted on the command bus 120. For example, the MM logic examines a bit mask in the PIM command that specifies two or more memory modules to process the special PIM command. If the memory module is included in the bit mask, then the MM logic processes the PIM command and obtains and stores the address information, e.g., row and column values, from the data bus 130. This may include providing row and column values to the row and column decode logic, or only a column value if a row has already been activated, so that the PIM unit can acquire data from the correct memory location.

The invention claimed is:

1. A memory controller comprising:
   command logic configured to:
   generate and transmit, via a command bus, a Processing-In-Memory (PIM) command to two or more PIM-enabled memory modules from a plurality of PIM-enabled memory modules for execution by the two or more PIM-enabled memory modules, wherein the PIM command includes one or more bit values that indicate that the two or more PIM-enabled memory modules, from the plurality of PIM-enabled memory modules, are to acquire the at least a portion of the address information for the PIM command from a non-command bus data path, and
   cause at least a portion of information required for the PIM command to be transmitted, via the non-command bus data path, to the two or more PIM-enabled memory modules from the plurality of PIM-enabled memory modules.

2. The memory controller of claim 1, wherein the information required for the PIM command includes one or more of different command information or different address information for at least two PIM-enabled memory modules from the two or more PIM-enabled memory modules.

3. The memory controller of claim 2, wherein the different address information includes one or more of different row values or different column values.

4. The memory controller of claim 1, wherein the PIM command includes different command codes for at least two PIM-enabled memory modules from the two or more PIM-enabled memory modules.

5. The memory controller of claim 1, wherein the PIM command includes a first portion of address information and the at least a portion of the address information transmitted via the non-command bus data path includes a second portion of the address information.

6. The memory controller of claim 1, wherein the PIM command includes one or more bit values that uniquely correspond to the two or more PIM-enabled memory modules from the plurality of PIM-enabled memory modules.

7. The memory controller of claim 1, wherein the command logic is further configured to generate the PIM command in response to one or more of:
   a number of PIM commands of a particular type that are addressed to individual PIM-enabled memory modules, from the plurality of PIM-enabled memory modules, being greater than a threshold number, or
   a utilization of the non-command bus data path satisfying a bus utilization threshold.

8. The memory controller of claim 7, wherein the command logic is further configured to determine the number of PIM commands of the particular type by one or more of examining PIM commands stored in one or more PIM command queues for the plurality of PIM-enable memory modules or PIM command counts by type for the plurality of PIM-enabled memory modules.

9. The memory controller of claim 1, wherein the PIM command instructs the two or more PIM-enabled memory modules, from the plurality of PIM-enabled memory modules, to store the at least a portion of information required for the PIM command transmitted via the non-command bus data path, and the command logic is configured to generate and transmit, via the command bus, a second PIM command to the two or more PIM-enabled memory modules, from the plurality of PIM-enabled memory modules, directing the two or more PIM-enabled memory modules to use the stored at least a portion of information.

10. A memory module comprising:
    memory module logic configured to:
    determine whether a Processing-In-Memory (PIM) command received, via a command bus shared by a plurality of PIM-enabled memory modules and a memory controller, from the memory controller and addressed to two or more PIM-enabled memory modules, from the plurality of PIM-enabled memory modules, is addressed to the memory module, and
    in response to determining that the PIM command received, via the command bus shared by the plurality of PIM-enabled memory modules and the memory controller, from the memory controller and addressed to the two or more PIM-enabled memory modules, from the plurality of PIM-enabled memory modules, is addressed to the memory module, and that the PIM command includes one or more bit values that indicate that the memory module is to acquire the at least a portion of the address information for the PIM command from a non-command bus data path, obtain at least a portion of information required for the memory module to execute the PIM command from the non-command bus data path shared by the plurality of PIM-enabled memory modules and the memory controller.

11. The memory module of claim 10, wherein the at least a portion of information required for the memory module to execute the PIM command includes one or more of command information or address information.

12. The memory module of claim 11, wherein the address information includes one or more of a row value or a column value that is different than a row or column value provided via the non-command bus data path to one or more other PIM-enabled memory modules from the two or more PIM-enabled memory modules.

13. The memory module of claim 11, wherein the command information includes command code information that is different than command code information provided via the non-command bus data path to one or more other PIM-enabled memory modules from the two or more PIM-enabled memory modules.

14. The memory module of claim 10, wherein the PIM command includes a first portion of address information and the at least a portion of the address information for the memory module to execute the PIM command received via the non-command bus data path includes a second portion of the address information.

15. The memory module of claim 10, wherein the PIM command includes one or more bit values that uniquely correspond to the two or more PIM-enabled memory modules from the plurality of PIM-enabled memory modules.

16. The memory module of claim 10, wherein the memory module logic is further configured to store the at least a portion of information required for the memory module to execute the PIM command obtained from the non-command bus data path shared by the plurality of PIM-enabled memory modules and the memory controller, and use the at least a portion of the information in response to a second PIM command received via the command bus that directs the two or more PIM-enabled memory modules, from the plurality of PIM-enabled memory modules, use the stored at least a portion of information.

17. A method comprising:
generating and transmitting, via a command bus, by command logic in a memory controller, a Processing-In-Memory (PIM) command to two or more PIM-enabled memory modules from a plurality of PIM-enabled memory modules for execution by the two or more PIM-enabled memory modules, wherein the PIM command includes one or more bit values that indicate that the two or more PIM-enabled memory modules, from the plurality of PIM-enabled memory modules, are to acquire the at least a portion of the address information for the PIM command from a non-command bus data path, and
causing at least a portion of information required for the PIM command to be executed by the two or more PIM-enabled memory modules from the plurality of PIM-enabled memory modules to be transmitted, via the non-command bus data path, to the two or more PIM-enabled memory modules from the plurality of PIM-enabled memory modules.

18. A system comprising:
a memory controller; and
two or more Processing-In-Memory (PIM)-enabled memory modules communicatively coupled to the memory controller via a command bus and a non-command bus data path;
wherein the memory controller is configured to:
generate and transmit, via the command bus, a PIM command to the two or more PIM-enabled memory modules for execution by the two or more PIM-enabled memory modules, wherein the PIM command includes one or more bit values that indicate that the two or more PIM-enabled memory modules, from the plurality of PIM-enabled memory modules, are to acquire the at least a portion of the address information for the PIM command from the non-command bus data path, and
cause at least a portion of information required for the PIM command to be transmitted, via the non-command bus data path, to the two or more PIM-enabled memory modules, and
wherein each PIM-enabled memory module, from the two or more PIM-enabled memory modules, is configured to:
determine whether the PIM command received from the memory controller via the command bus is addressed to the PIM-enabled memory module, and
in response to determining that the PIM command received from the memory controller via the command bus is addressed to the PIM-enabled memory module and that the PIM command includes one or more bit values that indicate that the memory module is to acquire the at least a portion of the address information for the PIM command from the non-command bus data path, obtain at least a portion of information required to execute the PIM command from the non-command bus data path.

* * * * *